United States Patent
Ju et al.

(10) Patent No.: US 6,927,599 B2
(45) Date of Patent: Aug. 9, 2005

(54) FAILSAFE FOR DIFFERENTIAL CIRCUIT BASED ON CURRENT SENSE SCHEME

(75) Inventors: Jianhong Ju, Gorham, ME (US); Pravas Pradhan, South Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/720,568

(22) Filed: Nov. 24, 2003

(65) Prior Publication Data

US 2005/0110515 A1 May 26, 2005

(51) Int. Cl.[7] .......................................... H03K 19/007
(52) U.S. Cl. ......................... 326/14; 326/83; 327/545
(58) Field of Search ............................ 326/14, 82, 83; 327/545, 530

(56) References Cited

U.S. PATENT DOCUMENTS

| | | | | |
|---|---|---|---|---|
| 6,288,577 | B1 | * | 9/2001 | Wong .......................... 327/65 |
| 6,320,406 | B1 | * | 11/2001 | Morgan et al. ................ 326/14 |
| 6,650,149 | B1 | * | 11/2003 | Wong .......................... 327/65 |

FOREIGN PATENT DOCUMENTS

| | | | | |
|---|---|---|---|---|
| JP | 03242035 | A | * 10/1991 | .......... H03K/19/00 |
| JP | 11295354 | | 10/1999 | |
| JP | 2002257869 | | 9/2000 | |

OTHER PUBLICATIONS

Texas Instruments Incorporated, SN65LVDS32B, SN65LVDT32B, SN65LVDS3486B, SN65LVDT3486B, SN65LVDDS9637B, SN65LVDT9637B High–Speed Differential Receivers, Oct. 2000 SLLS440A Product Reference, Revised May 2001, pp. 1–19.

MAXIM, Low–Jitter, 800Mbps, 10–Port LVDS Repeaters with 100Ω Drive, Application Notes for the MAX9153/MAX9154, Revised Oct. 2001, pp. 1–11.

Gingerich, Kevin, Wired–Logic Signaling With M–LVDS: High Performance Linear–Interface, Application Report SLLA119 for Texas Instruments, dated Oct. 2002, pp. 1–14.

International Search Report and the Written Opinion of the International Searching Authority for International Application No. PCT/US2004/037144, dated Mar. 9, 2005.

* cited by examiner

*Primary Examiner*—Daniel D. Chang
(74) *Attorney, Agent, or Firm*—Cesari and McKenna, LLP; Edwin H. Paul, Esq.

(57) ABSTRACT

A system and method are described for receiving differential currents in a current mode circuit. When conditions occur where the receiver inputs are floating, undriven, shorted together, or one or both shorted to ground, the output of the system remains stable. Diode connected MOS transistors receive the unequal currents, and current mirrors amplify the received currents. Those amplified mirrored currents are differentially amplified and converted into voltage signals suitable of typical computer and logic systems. The current mode differential nature of the invention provides high common mode current and voltage noise immunity. A threshold for the unequal currents helps provide high differential current and voltage noise immunity.

10 Claims, 2 Drawing Sheets

$i_1 = aI_p + bI_m$ — 13
$i_2 = bI_p + aI_m$ — 15
$i_1 - i_2 = (a - b)(I_p - I_m)$ — 17
$i_1 - i_2 > I_{th}$ — 19
$(a - b)(I_p - I_m) > I_{th}$ — 21

FAILSAFE FOR DIFFERENTIAL CIRCUIT BASED ON CURRENT SENSE SCHEME

BACKGROUND OF THE INVENTION

1. Field of the Invention

The present invention relates to logic differential logic/buffer circuits, and more particularly to current transfer logic circuits incorporating fail-safe circuitry.

2. Background Information

Fail safe differential amplifiers or receivers provide a known output when an indeterminate or invalid input signal is present at the inputs. An invalid input signal generally occurs when the inputs are floating or three-stated, or shorted. But partial shorts or opens may lead to invalid input signals. In the face of such invalid input signals the receivers usually will oscillate, switch on noise or will be in an indeterminate state.

Prior solutions have addressed voltage based and low voltage based circuits. These solutions have provided bias resistors at the inputs of the differential receiver to bias the inputs to a known condition by providing a dc offset at the inputs. But, such an offset may unbalance return currents, distort the output and possibly load and reduce the input signal amplitude. Other solutions have biased the inputs of the receiver to Vcc with logic to drive the receiver output to some known state.

Another solution for low voltage based circuits is found in Texas Instruments differential receiver, part no. SN65LVDT32B, and several other similar devices. The circuit of this device provides two active circuit high impedance comparators sharing the receiver inputs. These comparators provide a window with one comparator providing a +80 millivolt threshold and the other a −80 millivolt threshold. A fail-safe timer is "anded" with the comparator outputs and if the differential input is within the +/−80 millivolt window at the end of the timer period, the output is driven to a known fail safe high state. One limitation of this circuit is that the fail-safe timer must switch to start the time period. If the input to the receiver is valid, say more than +80 millivolts differential, but then reverts to an invalid state, say +10 millivolts differential, the timer may not be started since the receiver output may not switch.

Yet another fail safe device for low voltage circuits is produced by Maxim, part no. MAX9153/4. This device is labeled as a repeater, but in fact is a differential amplifier or receiver circuit. This circuit has diode spike suppressors and may not operate when powered up with the transmission line shorted, or with low level (under 100 millivolts) attenuated differential signals. High frequencies operation may be also impaired.

An objective of this invention is to provide an active failsafe receiver circuit that takes the output of the receiver to a stable known state if any of the following is true.

1. Receiver inputs are floating and unterminated.
2. Receiver inputs are terminated and undriven due to the driver being unpowered, disabled and/or disconneted.
3. The input cable is cut.
4. Receiver inputs are shorted together, say due to driver outputs being shorted, or one or both receiver inputs are shorted to ground due to the driver outputs puts being shorted to ground or there is a short in the cable.

None of these above conditions will produce an indeterminate output from the present invention and while under normal operation, the failsafe bias will not affect the receiver performance from both speed (bandwidth) and/or a jitter/noise point of view.

Another objective of the present invention is to provide a fail-safe current mode receiver that is competitive in power and chip area.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

SUMMARY OF THE INVENTION

In view of the foregoing discussion, the present invention provides a fail safe differential current logic receiver and method, the receiver including at least two inputs. A fail condition includes floating receiver inputs that are not driven, inputs that are shorted together, or inputs with one or both shorted to ground. In such conditions the present invention provides a first driver of current into a first input and a second driver of a different value current into the second input. The unequal currents are sensed and a differential current corresponding to the received unequal currents is provided. When any defined fail-safe condition exists the differential output current of the means for sensing remains stable.

In a preferred embodiment, a resistor is connected between the two inputs and a threshold differential current is established that needs to be reached to establish a changed logic state. The differential current is amplified and converted to an output voltage signal suitable for logic systems. A first and a second current receiving circuit is provided. One between the first input and a current return path and the second between the second input and the current return path. The first and second current receiving circuits are preferably diode connected MOS transistors each biased to present a given impedance between the inputs. A current mirroring circuit is used for each of the unequal received currents and a current to voltage converted provides a voltage output that is proportional to the difference between the received unequal currents. The unequal currents allows for positive currents to be shunted from each receiver input, and when the unequal currents reverse due to a logic change the difference between the unequal currents will be reversed allowing detection. If the positive currents received by the two diode connected CMOS transistors were equal, reversing them would not provide an output.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1A:
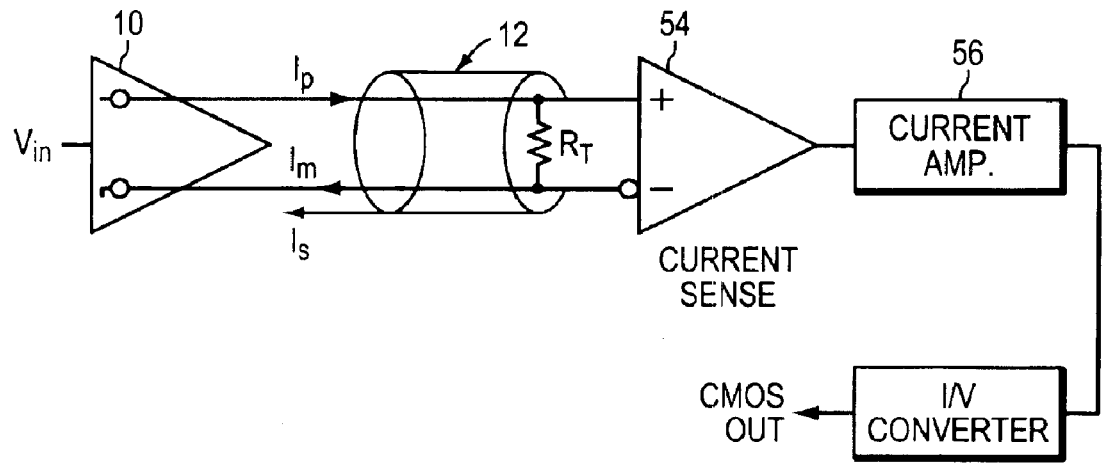
FIG. 1A is a current mode circuit illustrating the present invention.

FIG. 1A shows a diagram of a preferred embodiment of the present invention. An input signal, Vin controls and selects output current signals Ip and Im that are driven 10 into a transmission line 12. The driver 10 is a current driver with a high output impedance. In practice there may be a single twisted pair or two transmission lines, but as discussed below since Ip and Im are not equal, there will be a return current that is absorbed by the current sense amplifier when a twisted pair is used or that travels through a shield if present. Transmission lines are not fundamental to the practical use of the present invention, but if not used some noise friendly path must be provided for the return current Is. In one logic state Ip is a positive current out into a first transmission line 50 and Im is a negative current in from a second transmission line 52. In the opposite logic state Ip is a negative current from the first transmission line 50 and Im is a positive current into the second transmission line 52. In another preferred embodiment it is possible to have current driven only into one transmission line.

If two transmission lines are used each having has a characteristic impedance of 50 ohms, a 100 ohm Rt is placed across the distal ends of the signal conductors and serves to terminate both lines. Again, Ip and Im are not equal to each other so that there will be a return current Is through the shield. Also, since Rt is across the distal ends of two transmission lines, both ends of Rt will be biased at some positive voltage in this preferred embodiment. Preferably, in one logic state, Ia is a positive 1.0 ma and Im is a negative 0.5 ma, whereupon there is a return current, Is, in the shield of 0.5 ma. In the opposite logic state there still will be 0.5 ma returned through the shield.

FIG. 1A shows a current sense circuit 54 that receives the unequal currents that form a fail-safe basis of the present invention. When the driver of the unequal currents is powered down, the external noise current occurring on differential data lines will flow in the same direction. It appears as sources of common mode current noise signals that are rejected by the differential current sense circuit 54, as discussed in more detail below. In the case where the driver outputs are shorted together, the net 0.5 ma signal (Ip less Im), will flow down the paths to both ends of Rt, and so the differential sense 54 will distinguish this failure mode. As discussed below, jitter caused by a differential current is low since a valid input current during switching is much larger than the failsafe bias current.

Jitter is also lower than in voltage type circuits since the voltage gain of the current sense is low. Using a current sense circuit virtually eliminates the negative effects of capacitance multiplication of high gain voltage receiving amplifiers. The current sensing is, in this preferred embodiment, configured in parallel with Rt, and is described in more detail below. A current amplification circuit 56 receives the sensed current and finally a current to voltage (I/V) converter 58 provides a CMOS out signal compatible with standard computing circuitry. The present invention creates a voltage signal well away from the terminating and sensing circuitry. At such point of IN conversion, the circuit parasitic capacitance is relatively small and ineffective.

Referring to FIG. 1A, the differential current sense 54 has little voltage amplification so any Miller capacitor effects are negated. The differential nature of the current sense reduces the effects of common mode voltage signals—common mode voltage gain is very small or negligible.

Figure 1B:
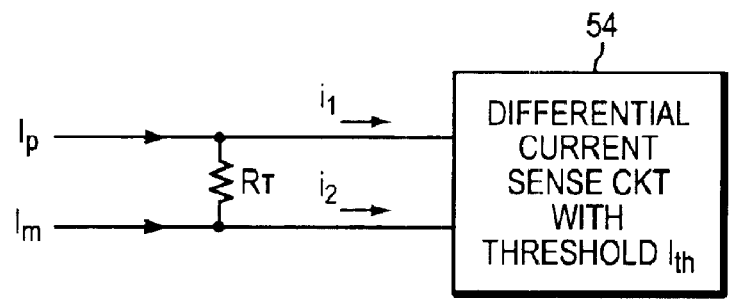
FIG. 1B is a block diagram with equations illustrating design considerations for embodiments of the present invention.

FIG. 1B illustrates the present invention's toleration of current noise. Generally, a portion of Ip and Im, i1 and i2, travels through to the differential current sense circuit 54. The current sense 54 designed with a differential current threshold Ith that must be reached in order for the valid logic signal to be recognized. So the differential between Ip and Im must result in a differential between i1 and i2 that equals (or is greater than) the threshold Ith. In general, expressions, 13 and 15, respectively, for i1 and i2 are shown as functions of Ip and Im. If i2 is subtracted from i1, the result is shown in item 17. Since i1−i2 must equal or exceed Ith, 19, the expression for Ith as a function of Ip and Im is shown in item 21. Evident from inspection is that Ip−Im must be large enough to ensure that i1−i2 exceeds the threshold. Under normal failsafe conditions, if the difference between $I_p$ and $I_m$ is not big enough, the difference between a and b (current distribution coefficients) is also small, which makes the equation of 21 very difficult to hold. In real application, it means that the receiver will be very robust against noise once it enters failsafe mode. It is evident from 21, that common mode current noise will cancel each other making this embodiment robust against common mode current noise. In a preferred embodiment, the present invention will tolerate 100 uA of differential current noise. Other embodiments can be designed with greater noise immunity. Please note that i1 and i2 are both positive but of unequal values. If they were equal, there would be no difference when a logic level change occurs. These currents are usually not equal to each other except when the lines short together. Under such conditions, the receiver will maintain the stable output with internal failsafe bias transistors $P_{fl}$ and $N_{fl}$ in FIG. 4. This offset provides the fails safe action of the present invention, but, in a preferred embodiment, only about 20 uA of offset current generates very little additional power consumption, and embodiment of the present invention use virtually no extra die area.

Figure 2:
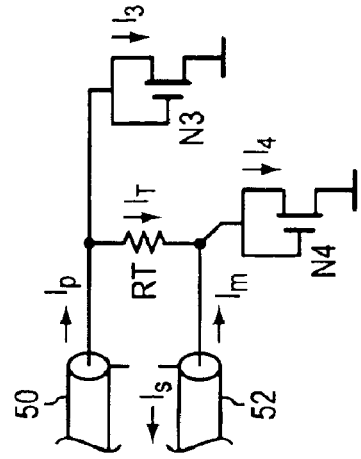
FIG. 2 is a detailed circuit schematic consistent of a current driver suitable for use with the present invention.

FIG. 2 shows one current driver circuit that may be used in accordance with the present invention. Here, when V1 is low P1 is on and I1, 1 mA, travels via P1 out as Ip . If V2 is high N2 is on and I2, 0.5 mA, travels out via N2 as a negative Im. Reversing the logic states of V1 and V2, I2 travels out as a negative Ip and I1 travels out as a positive Im. Typically, V2 is designed as the logic inverse of V1 for the above operation. However, if P1, P2, N1 and N2 are driven independently (not shown), it will be possible to turn them all off leaving no current in the transmission lines. It should be noted that there is no common mode feedback circuit (CMFB) to stabilize the common mode level of the output voltage. Typically this type of output driver is common for low voltage differential systems. The present system does not require the CMFB due to the special receiver 54 used. Thus not using the CMFB circuit saves chip space and power.

Figure 3:
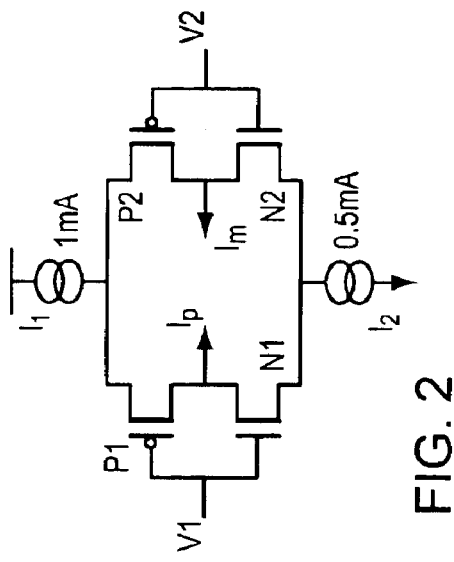
FIG. 3 is a circuit illustrating current sensing.

FIG. 3 is a schematic of a current sensing circuitry consistent with a preferred embodiment of the present invention. Here two diode connected NMOS transistors, N3 and N4, are biased to siphon off I3 and I4, respectively, from currents in the transmission lines. N3 and N4 may be biased (not shown) along the diode-like curve to overcome any threshold and to present an impedance substantially greater than Rt to minimally affect the termination of the transmission lines. In one preferred embodiment N3 and N4 exhibit about 1 K ohms each, although other impedances can be used as known in the art. If N3 and N4 present about 2 K ohms across an equivalent 100 ohm transmission line, the Rt can be made equal to 105 ohms or appropriately higher or lower to maintain proper transmission line termination. However, as is known in the art, there is likely to be some harmless ringing due to some impedance mismatch even if care is taken to keep the diode transistors at a high impedance state. For example if Rt is 105 ohms across a 100 ohm transmission line, and the diode connected transistors present, for some processing reason, very high impedances, the 5 ohm mismatch will only result in a reflection coefficient of about less than 2.5 percent.

Still referring to FIG. 3, consider that Ip is plus 1 ma, Im is negative 0.5 ma, then the current back through the shields, Is, will be 0.5 ma. N3 and N4 can be designed so that It is 0.65 ma, with N3 drawing I3 of 0.35 ma and N4 drawing I4 of 0.15 ma. The difference between I3 and I4, or 0.2 ma, is sensed, as discussed below, to indicate a logic signal, say a logic one. The negative of that logic signal is sensed when Ip and Im exchange current levels when the input signal to the current drive changes state. In this state I3 and I4 will exchange current levels and 0.2 ma difference is sensed as a logic zero. So a logic change from one to zero will result in 0.4 ma change in current.

Figure 4:
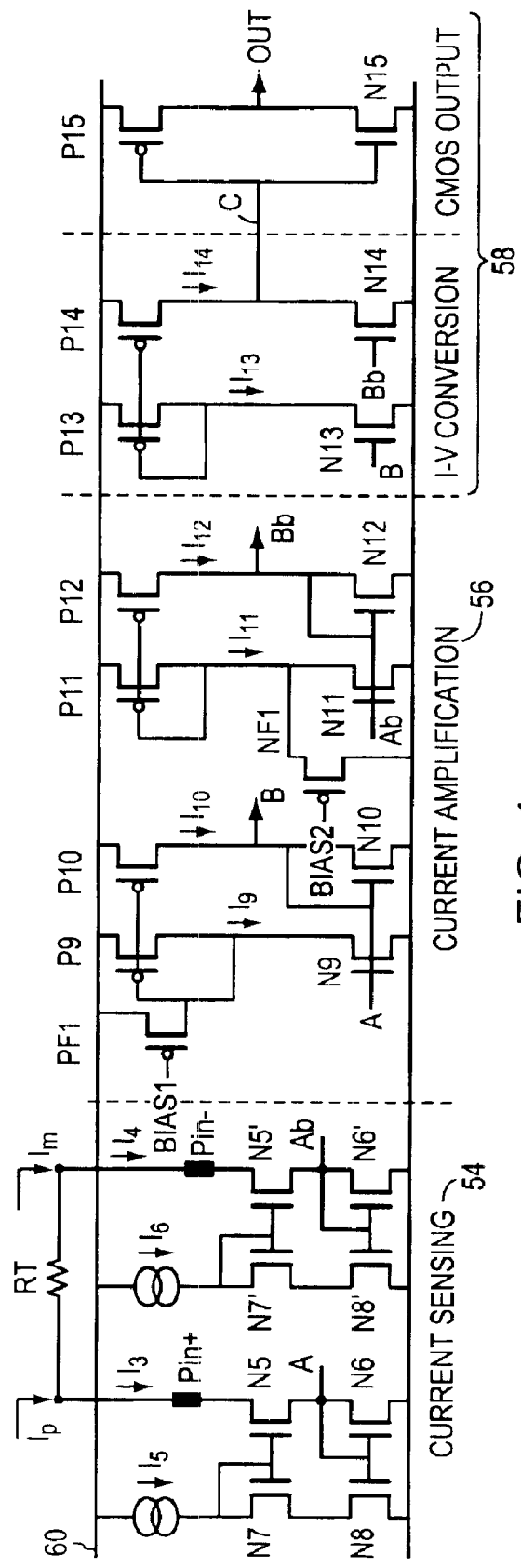
FIG. 4 is a combined schematic of an inventive receiver circuit.

FIG. 4 shows a more detailed complete receiver circuit implementation of the blocks of FIG. 1 positioned at the termination circuit end of the two transmission lines 50 and 52. The Rt is connected from Pin+ to Pin- as shown, with Ip and Im driving the two ends of Rt, as shown in FIG. 3. FIG. 4 shows the schematics of the current sense circuit 54, current amplification circuit 56, and current to voltage, I/V, circuit 58.

In FIG. 4 the current sense circuit 54 is formed by a circuit attached to each end of Rt, with a current source I5 and I6 feeding each circuit. As known in the art, these current sources will be typically formed by biasing PMOS transistors to the positive power rail 60. The current sensing circuit for I3 includes N5–N8. N7 and N8, and the current sensing circuit for I4 includes N5'–N8.' N7 and N7' are diode connected NMOS transistors that share equal drain currents with N8 and N8', respectively. Since N7 and N8 io have the same drain current (I5) the gate to source voltage for N7 and N8 are equal, assuming matched transistors. The discussion for N5–N7 with respect to I3 applies directly to N5'–N7' with respect to I4, and so is not repeated below. N6 is the diode connected transistor arranged with N5 forming a controlled transistorized linear resistance to bias the diode connected devices away from the knee region and thus increase the current sensitivity. Resistances of N5 and N5' are controlled by the gate voltage of N7 and N7,' respectively, which in turn depends on current in the diode connected devices N6 and N6.' Thus the current information from the sensing element (diode connected device) is used to modify the resistance of N5 or N5' such that the effective current difference between the two branches can be increased. Resistance also has a dampening effect on a high frequency noise which appears on node A and Ab. In this circuit arrangement I5, N7 and N8 control, via the mirroring effect, I3 and the voltage drops across N5 and N6, as follows. The same current will travel through N5 and N6 so that their gate to source voltages will be equal to each, and the voltage at Pin+via the N7 mirror. In this manner the offset voltage of the diode connected N6 can be compensated and the impedance of N6 can be controlled.

The gates of N9 and N10 connect to the drain of N6, marked A, forming a current mirror. Similarly, N11 and N12 mirror the current in N6.' N10 and N12 are sized to provide amplified currents sensed by the I–V conversion circuit via B and Bb. When I3 changes, in a preferred embodiment from 0.15 ma to 0.35 ma, this change is reflected at I9 and I10 via the current mirror amplification circuit 56. Failsafe bias transistors $P_{fl}$ and $N_{fl}$ are biased to form internal failsafe bias current to maintain the output at a known state once the receiver enters failsafe conditions such as power down of driver or cable short. In one preferred embodiment and as known in the art, bias1 and bias2 can be constructed with band gap devices that are selected together with the characteristics of $P_{fl}$ and $N_{fl}$ to provide maintenance currents of about twenty microamps in I9 and I11. I10 can be made as an amplified version of the I3 change by sizing the transistors as is known in the art. Also, P9 is arranged as a diode connected transistor and may be biased (not shown) and I10 will mirror I19 but may be amplified by sizing P10. The gate to source voltage of P10 and P9 are equal. This provides the current amplification so that I10 is an amplified version of I3. A similar circuit receives I4 and provides an amplified version at I12.

FIG. 4 item 58 shows a circuit that performs the voltage conversion. The two outputs, B and Bb, are input to the gates of N13 and N14, respectively. I13 and I14 are mirrors of I10 and I12, respectively. P13 and P14 are current mirrors. There is a full differential operation using B and Bb providing a voltage output at C that drives N15 and is P15 act to provide the rail to rail CMOS logic levels.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A fail-safe system for differential current logic receiver circuits, wherein a fail-safe condition includes receiver inputs that are,floating, undriven, shorted together, or one or both shorted to ground, the fail-safe system comprising:
   a current mode differential receiver defining first and second inputs,
   a first driver of current into the first input and a second driver of current into the second input, wherein the first and the second currents are not equal to each other under normal operation,
   means for sensing the unequal currents and outputting a differential current corresponding to the received unequal currents, wherein in any defined fail-safe conditions the differential current output of the means for sensing remains stable.

2. The fail-safe system of claim 1 wherein the means for sensing comprises:
   means for establishing a differential current threshold wherein when the threshold is reached the means for sensing outputs a changed logic state.

3. The fail-safe system of claim 1 further comprising:
   a differential current amplifier arranged to accept the differential current output of the means for sensing and provide an amplified current, and
   a current to voltage converter that accepts the amplified current and outputs a voltage signal consistent with logic system.

4. The fail-safe system of claim 1 further comprising a resistor connected between the first and the second inputs.

5. The fail-safe system of claim 1 wherein the means for sensing comprises:
   a first current receiving circuit connected between the first input and a current return path back to the current drivers, a second current receiving circuit connected between the second input and a current return path back to the current drivers.

6. The fail-safe system of claim 5 wherein the first and second current receiving circuits comprise diode connected MOS transistors.

7. The fail-safe system of claim 6 further comprising means for biasing each diode connected MOS transistor so that each presents a given impedance to a current return path to the current drivers.

8. The fail-safe system of claim 5 further comprising means for comparing the currents in the first receiving circuit to the current in the second receiving circuit.

9. The fail-safe system of claim 8 wherein the means for comparing comprise:

a first amplifying current mirroring circuit providing a first mirrored output current of the current received by the first receiving circuit, a second amplifying current mirroring circuit providing a second mirrored output current of the current received by the second receiving circuit, and a current to voltage conversion circuit, arranged to receive the first and the second output currents and provide a voltage output that is proportional to the difference between the outputs of the first and the second amplifying current mirroring circuits.

10. A method for generating a fail-safe condition system for differential current logic receiver circuits when receiver inputs are: floating, undriven, shorted together, or one or both shorted to ground, the method comprising the steps of:

receiving external differential noise currents with a current mode differential receiver defining first and second inputs, driving a first current into the first input and a second current into the second input, wherein the difference between external current noise on differential data lines is usually not big enough to overcome the threshold set by the failsafe bias transistors internally under failsafe condition, sensing the unequal currents efficiently while under normal operation, and outputting a stable known state while under fail-safe conditions.

* * * * *